United States Patent [19]
Mori

[11] Patent Number: 5,895,483
[45] Date of Patent: Apr. 20, 1999

[54] DISK ARRAY SYSTEM FOR PERFORMING FREQUENCY DIVISION MULTIPLEX TRANSMISSIONS

[75] Inventor: Kenji Mori, Hiratsuka, Japan

[73] Assignee: Hitachi, Ltd., Tokyo, Japan

[21] Appl. No.: 08/698,846

[22] Filed: Aug. 16, 1996

[30] Foreign Application Priority Data

Aug. 31, 1995 [JP] Japan ................................. 7-223025

[51] Int. Cl.$^6$ .......................... G06F 13/16; G06F 13/18; G06F 11/10
[52] U.S. Cl. ...................... 711/114; 395/182.05; 395/894; 395/861; 395/182.04
[58] Field of Search ........................... 711/114; 395/841, 395/894, 861, 182.05, 182.04

[56] References Cited

U.S. PATENT DOCUMENTS 5,542,064  7/1996  Tanaka et al. .......................... 711/114
5,583,876  12/1996  Kakuta .................................. 711/114

Primary Examiner—Reginald G. Bragdon
Attorney, Agent, or Firm—Antonelli, Terry, Stout & Kraus, LLP

[57] ABSTRACT

A disk array system employs a frequency division multiplex transmission scheme as a transmission system for use in an interface that connects disk drives to disk drive interface controller circuits, for performing the simultaneous transmission of a plurality of data over a single interface line while allowing the transmission frequency to be changed automatically with respect to the individual one of control devices and disk drives.

8 Claims, 15 Drawing Sheets

1

DISK ARRAY SYSTEM FOR PERFORMING FREQUENCY DIVISION MULTIPLEX TRANSMISSIONS

BACKGROUND OF THE INVENTION

1. Field of the Invention

The present invention relates in general to computer mass storage devices, and in more particular to disk array systems for use in computers and electronic equipment, having disk arrays and disk drive control circuitry therein.

2. Description of the Prior Art

Conventionally, when a number of disc or disk drives are connected together in a disk array, there is a method for connection thereof by use of cross-bar switches. In this respect, the small computer system interface (SCSI) is typically used as the input/output (I/O) interface of such disk drives. This system employs a specific scheme for parallel transmission of data in a time division fashion. With this scheme, any accesses to an initiator is simply attained by one-to-one communications over one transmission line path at a time, which suffers from a problem in that disk drives cannot communicate with an increased number of initiators simultaneously. In addition, this scheme strictly requires the use of a limited number of disk drives that can be connected to a single line path, the upper limit of which remains as small as on the order of several tens or less; accordingly, an approach is to employ a method of using associative cross-bar switches enabling a decreased number of controller circuits to control a virtually increased number of disk drives.

To enhance the transaction performance in disk accessing, another approach is also known which attempts to accomplish this by providing a plurality of disk drives. With such a technique, since low-speed operations of seeking mechanisms or the like can be carried out in a parallel manner, it becomes virtually possible to execute a number of processing procedures within a certain time period. Furthermore, it may also be considered that a further increased number of disk drives will be able to be employed due to down-sizing of disk drives in near future. With regard to connection between disk control devices and disk drives, most systems presently employ the interface using SCSI; however, when this interface is applied causing a single interface to attain one-to-one connection for an add-in drive(s), a plurality of interface units should be required raising a difficulty in assembly of these interface units.

Furthermore, the disk drives capable of being connected using one controller is kept decreased in number. To break through this limit, a correspondingly increased number of controllers are to be utilized; alternatively, a branch exchange module is required to compensate for such limitation. This will require the use of an extra controller(s) for control of the branch exchange module, with the result in the essential parts or components being increased in number, which may lead to complexity of dynamic control thereby rendering it difficult.

SUMMARY OF THE INVENTION

It is therefore an object of the present invention to provide a new and improved disk array control scheme capable of avoiding the problems faced with the prior art.

It is another object of the invention to provide an improved disk array system capable of reducing size and yet attaining enhanced performance.

It is a further object of the invention to provide an improved disk array system adaptable for use in computer systems, capable of performing simultaneous transmission of a plurality of data packets over a single interface line thus enabling a decreased number of controllers to control an increased number of disk drives as installed therein.

In accordance with one aspect of the present invention, since the disk array system is specifically arranged to permit transmission of an increased amount of data over a single interface line, it becomes possible, by use of the frequency division multiplex (FDM) transmission scheme performing frequency-multiplexing within the same time period and transferring a plurality of data simultaneously, to allow a number of disk drives to be connected using a decreased number of controllers therefor.

In accordance with another aspect of the invention, an increased number of disk drives can virtually be controlled by use of a smaller number of disk drive controller circuits associated therewith, by dynamically changing over the data transmission frequency with respect to a respective one of the disk drive groups.

Due to the possibility of transmitting a plurality of data over a single interface line simultaneously as resulted from the use of the FDM transmission scheme, extra interface lines for a plurality of disk drives are no longer required, thus making it possible to avoid any assembly problem in practical use which can otherwise occur in the prior art when an increased number of disk drives are to be employed.

In accordance with still another aspect of the invention, the dynamic change-over of transmission frequency with respect to every disk drive controller and each disk drive group may advantageously serve as an alternative to the use of cross-bar switches, while the control operation for such special, independent cross-bar switches is not required any more. As a result of the above arrangements, it becomes possible to construct a small-size high-performance disk array system.

These and other objects, features and advantages of the invention will be apparent from the following more particular description of preferred embodiments of the invention, as illustrated in the accompanying drawings.

DETAILED DESCRIPTION OF THE INVENTION

Figure 1:
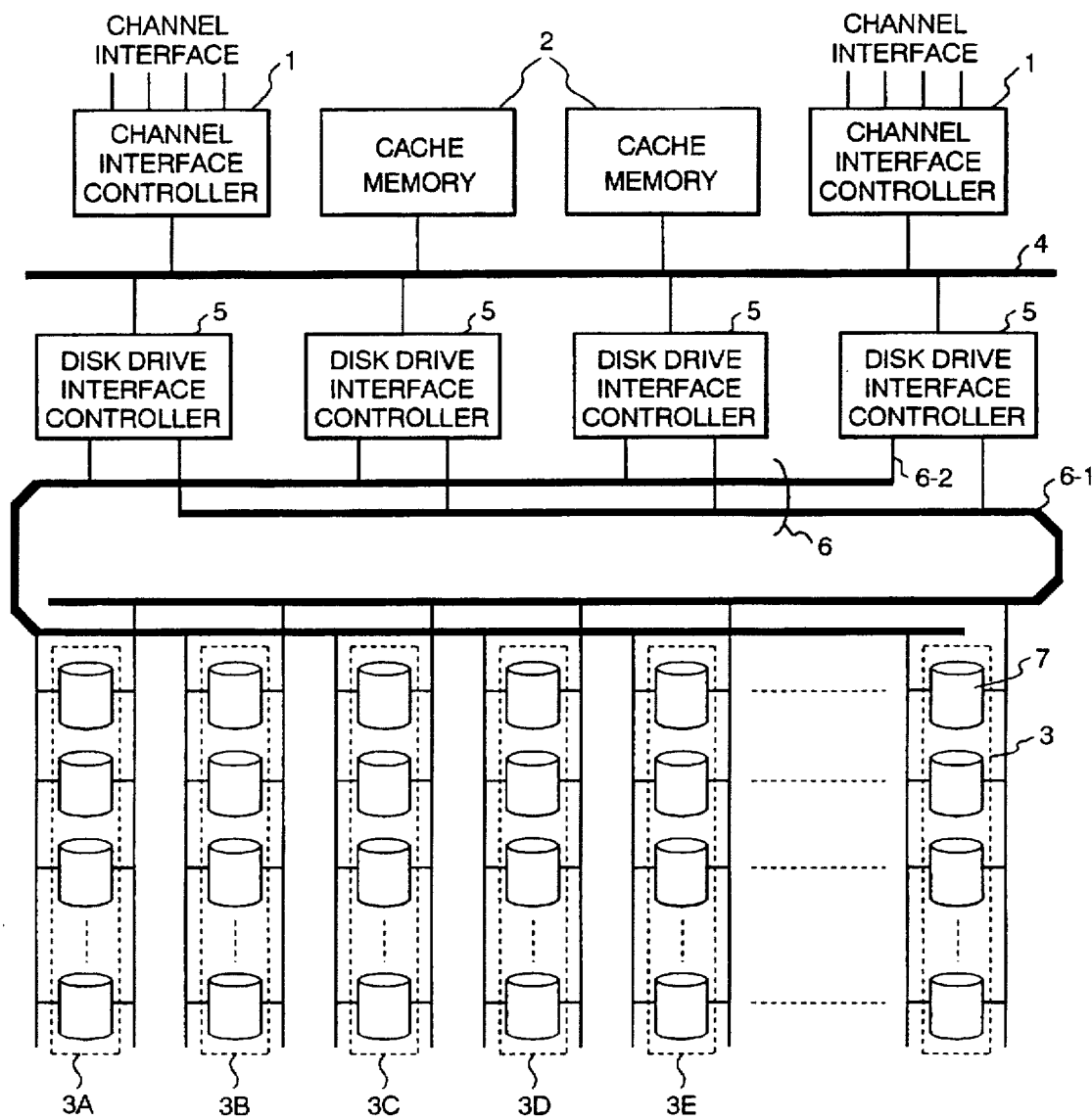
FIG. 1 is a diagram showing a system configuration of a disk array system in accordance with one preferred embodiment of the invention.

Referring to FIG. 1, a disk array system in accordance with one illustrative embodiment of the invention employs the frequency division multiplex (FDM) transmission scheme for a disk drive interface that provides interconnections between disk drive interface controller circuits and a disk drive array.

The disk array system of FIG. 1 includes channel interface controllers 1, cache memories 2, disk drive interface controllers 5, an internal data bus 4 for interconnection among them, an FDM transmission interface 6, and an array of magnetic disk drives 7. These disk drives 7 may be magnetic fixed disk drive units which are organized into several groups including disk drive groups 3A, 3B, 3C, 3D, 3E, . . . , which assign frequencies for data transmission. Identification of each disk drive group is carried out based on addressing of respective disk drives. Here, the illustrative configuration of disk arrays consisting of a number of disk drives 7 follows the redundant array of inexpensive disks (RAID) level five (5) standards, wherein four data disk drives (designated by numeral 24 in FIGS. 4 through 13) and one parity disk drive (25 in FIGS. 4 to 13) are arranged therein.

As can be seen from FIGS. 4 to 13, the individual disk drive interface controller 5 has four disk drive interface ports P1 to P4, and two interface connection paths C1, C2, for connecting with the disk drives 7 while suitably setting the frequency values for each disk drive interface such that any assigned frequencies are prevented from overlapping each other. Note that the reference characters for the ports P1–P4 and connection busses C1, C2 are indicated with respect only to one disk drive interface controller 5c for purposes of simplification of illustrations of FIGS. 4 through 13.

The interconnection between the disk drive interface controllers 5 and disk drives 7 are also attained using two line paths 6-1, 6-2, which act as alternative bus lines upon occurrence of any possible fault or malfunction, and each of which is physically connected to all of the disk drives. Typically, it may be preferable that these two busses are used to enable execution of any accessing procedures directed to the same disk drive group, thereby providing efficient use thereof. Details thereof will be described later in this description.

Figure 2:
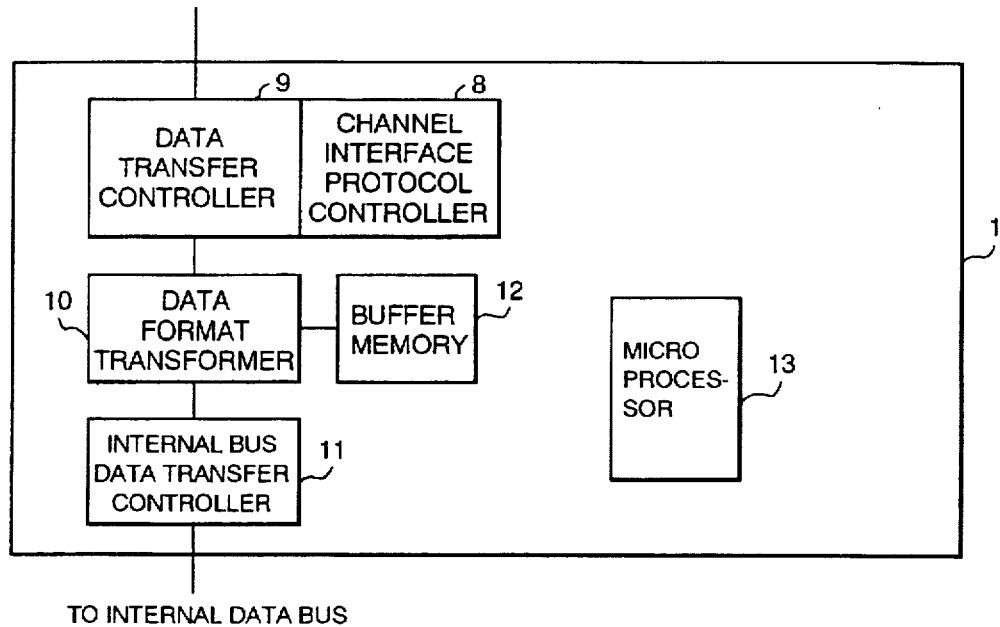
FIG. 2 is a block diagram of a channel interface controller circuit included in the disk array system.

FIG. 2 is a diagram showing the internal configuration of one channel interface controller 1. As shown in this drawing, the channel interface controller 1 is comprised of a channel interface protocol controller 8, a data transfer controller 9, a data format converter 10, an internal bus data transfer controller 11, a buffer memory 12, and a microprocessor 13.

Figure 3:
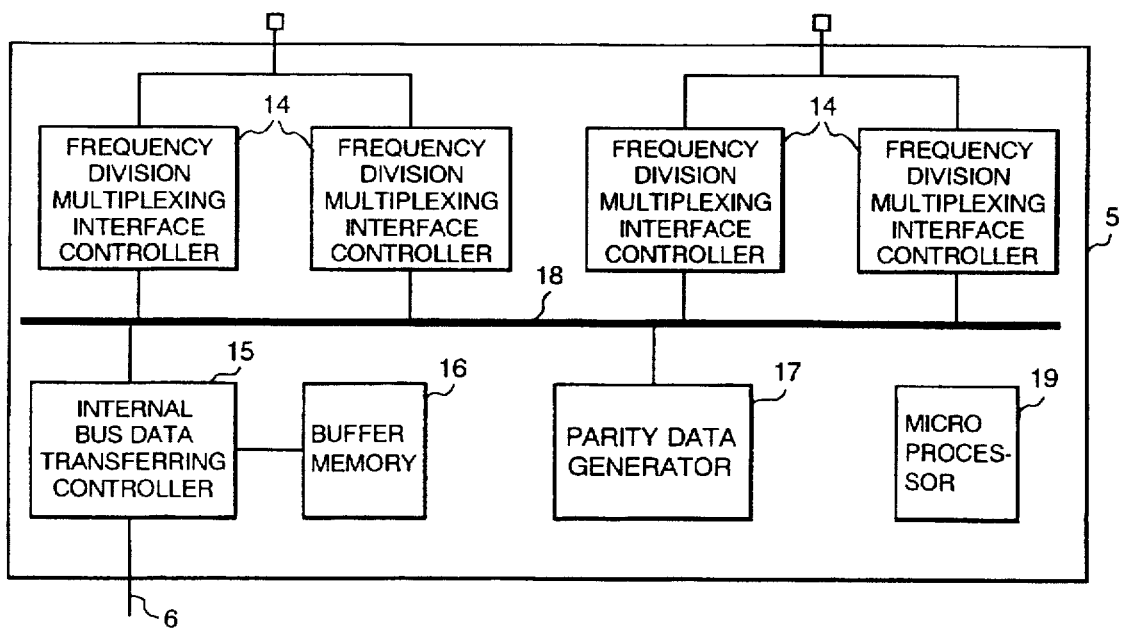
FIG. 3 is a block diagram of a disk drive interface controller included in the system.

FIG. 3 is a diagram showing the internal configuration of one disk drive interface controller 5.

As shown, this interface controller 5 includes an FDM interface controller 14, an internal bus data transfer controller 15, a buffer memory 16, a parity data generator 17, a disk drive interface controller's internal bus 18 and a microprocessor 19.

A description will now be given of a data flow between a host computer not shown and the disk drives 7.

At the outset, a case is discussed where data are written from the host computer into a disk drive designated.

The channel interface controllers 1 shown in FIG. 1 are connected to a computer such that the channel interface protocol controller 8 of FIG. 2 executes protocol control of channel interface and command analysis, while allowing the data transfer controller 9 to transfer data from the host computer toward the data format converter 10, which then performs required data format conversion from a count key data (CKD) format into a fixed block architecture (FBA) format. Thereafter, the internal bus data transfer controller 11 carries out data transfer with respect to the cache memories 2. In this situation the cache memories 2 temporarily provide a buffer function in such data transfer. A subsequent operation may vary depending upon the actual amount of write data as categorized in seven possible cases (1) through (7) as will be described below on a case-by-case basis.

(1) Case of Executing Entire Stripe Write using Two Passes

Figure 4:
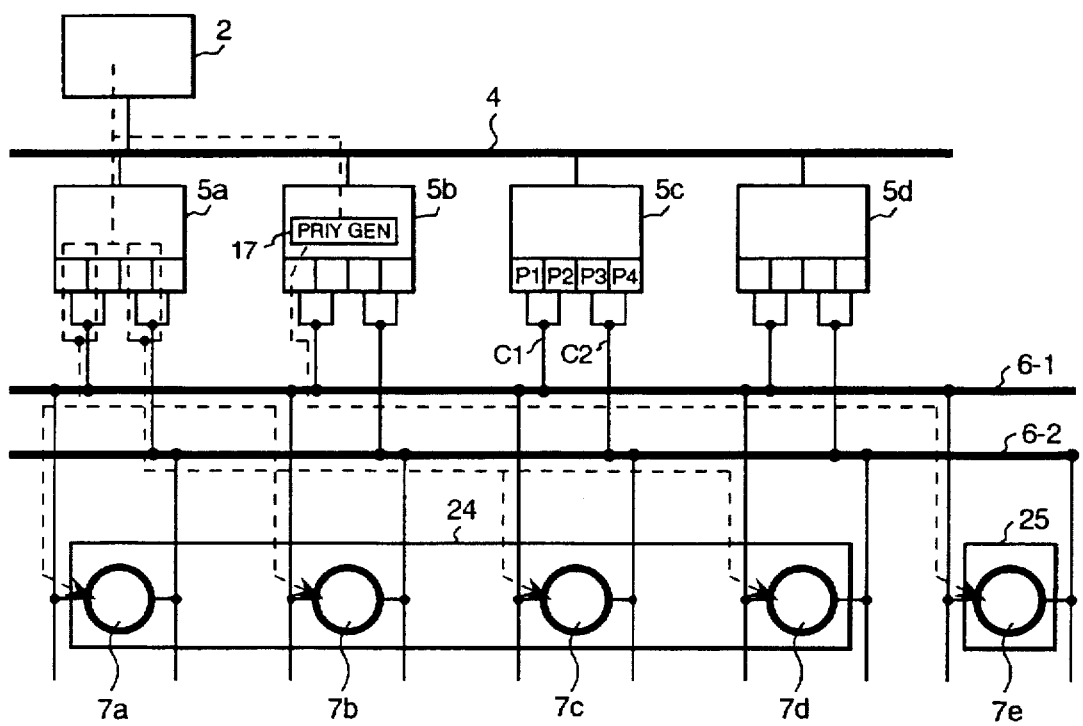
FIG. 4 is a diagrammatic representation of a data flow during an all-stripe data write period using two passes.

An explanation will be given with reference to FIG. 4. The channel interface controllers 1 inform the disk drive interface controllers 5 of the occurrence of a write event, causing two interface controllers 5—for example, 5a, 5b—to be selected from among the disk drive interface controllers 5. Respective disk drive interface controllers 5a, 5b cooperate with each other to transfer data from the cache memories 2 to the data disk drives 7a–7d. At this time, the disk drive interface controller 5a attempts to transfer write data to the data disk drives 7a, 7b simultaneously by use of four ports P1–P4 and two interface connection paths C1, C2. The four ports of the disk drive interface controller 5a at this time are set at a frequency identical to that of each of data disk drives 7a–7d. The remaining disk drive interface controller 5b generates and issues parity data in response to the data as transferred from the cache memories 2, causing write data to be transferred toward the parity disk drive 7e. In this way, a series of write operations of entire stripe write through two paths are completed.

(2) Case of Executing Entire Stripe Write with One Path

Figure 5:
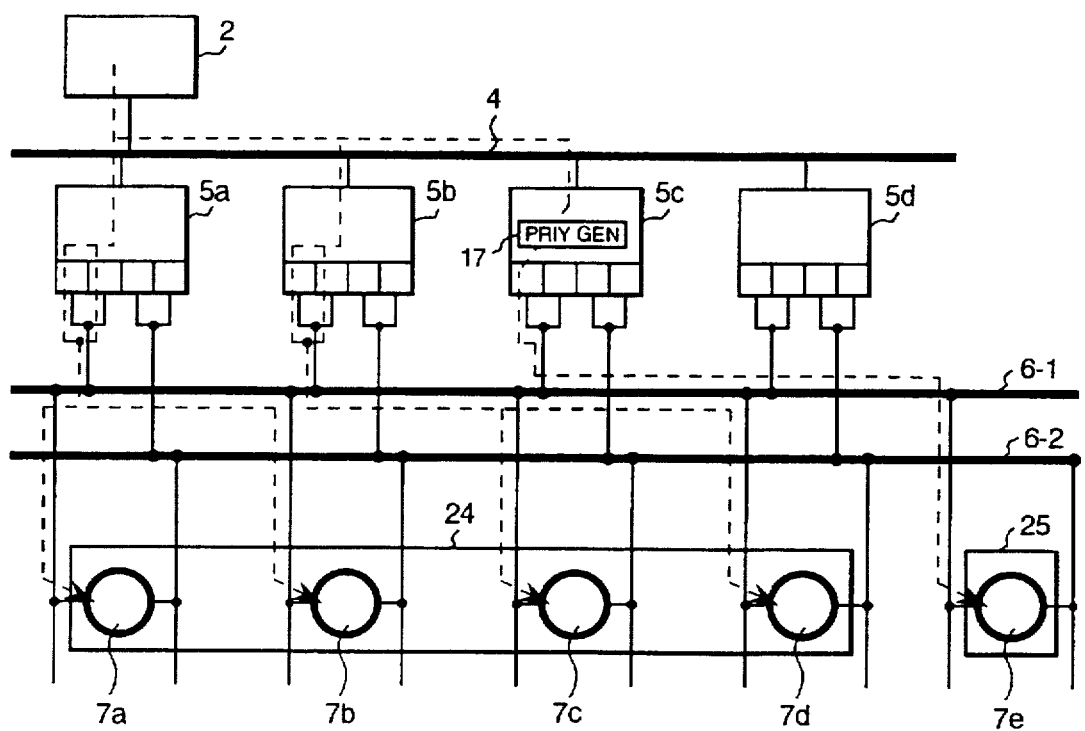
FIG. 5 is a diagrammatic representation of a data flow during an all-stripe data write period using one pass.

An explanation is now given with reference to FIG. 5. When one path is used, three disk drive interface controllers are utilized. This acts as a means that is adaptable for use when any fault or malfunction takes place over one path from the disk drive interface controllers to the disk drives. The channel interface controllers notify the disk drive interface controllers of the occurrence of a write event, causing three disk drive interface controllers 5a, 5b, 5c which have received such notice to be selected and used for data transmission respectively.

First of all, transmission of write data being stored in the data disk drives 7a, 7b is performed from the cache memories 2 toward the disk drive interface controller 5a. Thereafter, write data being aimed at the data disk drives 7c, 7d are then transferred from the cache memories 2 to the disk drive interface controller 5b. Upon receipt of such data, these interface controllers 5a, 5b execute write data transmission toward the data disk drives 7a–7d. In this case, the transmission frequency is rendered variable enabling achievement of simultaneous data transmission.

On the other hand, the disk drive interface controller 5c develops parity data based on the data as originated from the data disk drives 7a–7d and received from the cache memories 2, thereby causing write data to be transferred to the parity disk drive 7e. The frequency at this transmission is changed so that it differs from those of the data disk drives 7a–7d, enabling simultaneous transmission. In this way, a series of write operations of all-stripe-write-via-one-path are completed.

(3) Case of Executing One Stripe Write

Figure 6:
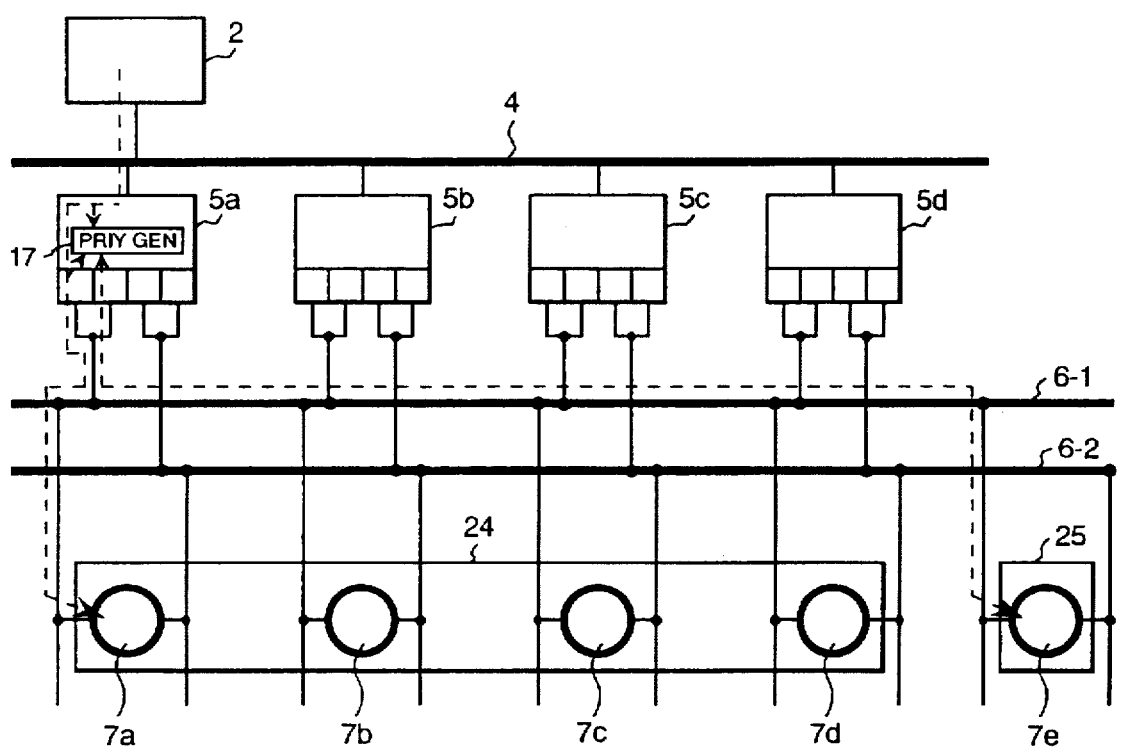
FIG. 6 is a diagrammatic representation of a data flow during a one disk-drive write period.

An explanation is now presented with reference to FIG. 6. In this case, one disk drive interface controller is used for execution of operations. The channel interface controllers 1 notify the disk drive interface controllers 5 of the occurrence of a data write event. Upon receipt of this notice, one disk drive interface controller 5a is selected so that data transmission is performed from the cache memories 2. The presently selected disk drive interface controller 5a makes use of two ports to execute data read transmission of data disk drive 7a whereat a write event occurred and of the parity disk drive 7e. Based on data as transferred from these disk drives 7a, 7e and data from the cache memories 2, new parity data may be generated and issued as write data for the parity disk drive 7e. The parity data and data from the cache memories 2 are then transferred as write data toward the parity disk drive 7e and the data disk drive 7a. In this way, a series of write operations of 1-stripe write are completed.

(4) Case of Performing Two-Stripe Write with Two Paths

Figure 7:
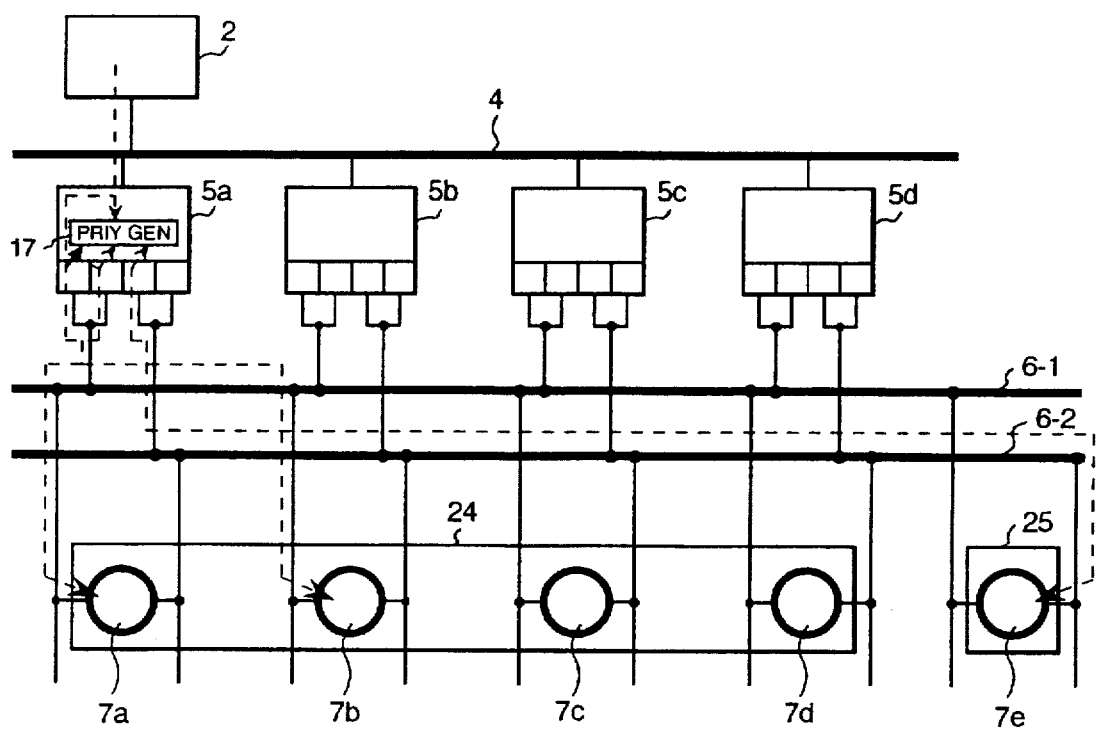
FIG. 7 is a diagrammatic representation of a data flow during a write period for two disk drives using two passes.

An explanation will be given with reference to FIG. 7. In this case, the write operation is effected by use of one disk drive interface controller. The channel interface controllers 1 notify the disk drive interface controllers of the fact that a write event occurred. Upon receipt of such notice, one disk drive interface controller 5a is selected for data transmission from the cache memories 2. On the other hand, data read transmission is performed from two data disk drives 7a, 7b at which the write event occurred and from the parity disk drive 7e. During such data transmission the transmission frequency is varied with respect to each one of these disk drives. Thereafter, based on two old data and one old parity of each disk drive and the data as transferred from the cache memories 2, new parity data may be developed as write data for the parity disk drive 7e. The present data and the data transferred from the cache memories 2 are then transferred as write data to the parity disk drive 7e and the data disk drives 7a, 7b. In this way, a series of 2-stripe write/2-path operations are completed.

(5) Case of Performing Two-Stripe Write using One Path

Figure 8:
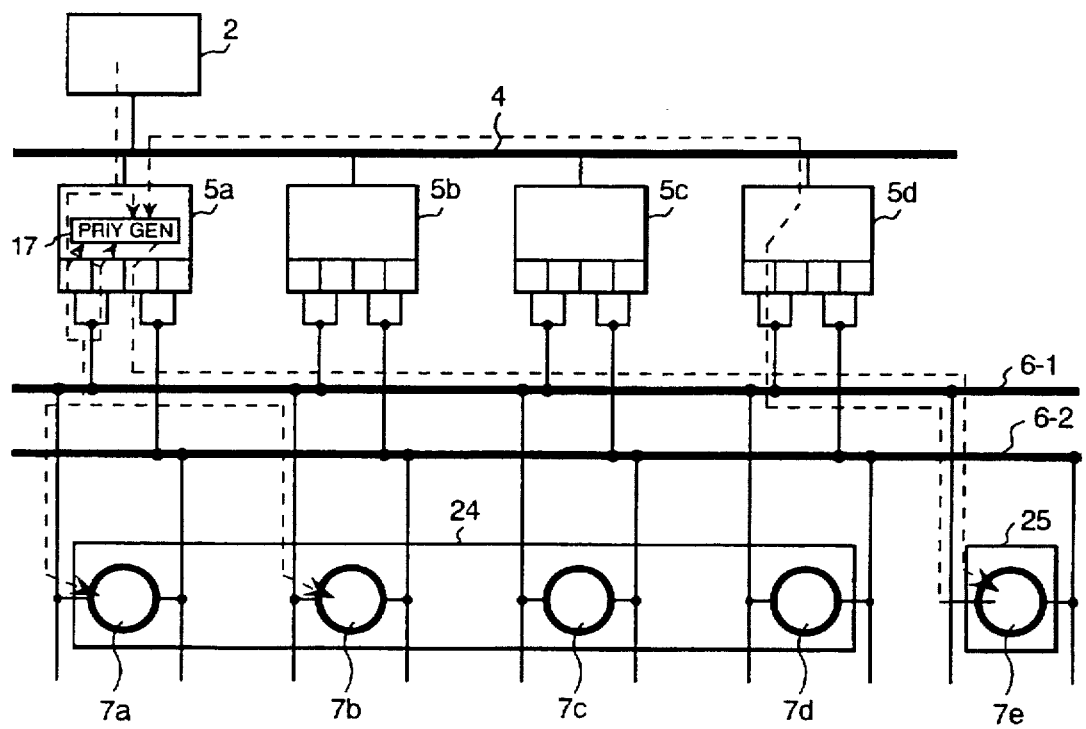
FIG. 8 is a diagrammatic representation of a data flow during a write period for two disk drives using one pass.

An explanation will be made by reference to FIG. 8. In this case the write operation is performed using one disk drive interface controller. When the channel interface controllers notify the disk drive interface controllers of the occurrence of a write event, two disk drive interface controllers 5a, 5d that received such notice are then selected causing data transmission to be effected from the cache memories 2 to the disk drive interface controller 5a. On the other hand, the disk drive interface controller 5d carries out read data transfer of old data of the parity disk drive 7e. Simultaneously, read data transfer is also carried out for the old data of the data disk drive 7a whereat the write event occurred. Thereafter, data transfer is done from the disk drive interface controller 5d through the internal bus 4 toward the disk drive interface controller 5a. This data, the old data of the data disk drive 7a and the data transferred from the cache memories 2 are then used to generate and issue new parity data, which may serve as write data for the parity disk drive 7e. During such parity generation period, write data transfer is carried out for the data disk drive 7a. Subsequently, the port frequency is changed over causing data transfer of new parity to be performed with respect to the parity disk drive 7e. In this way, a series of 2-stripe write/1-path write operations are completed.

(6) Case of Performing Three-Stripe Write using One Path

Figure 9:
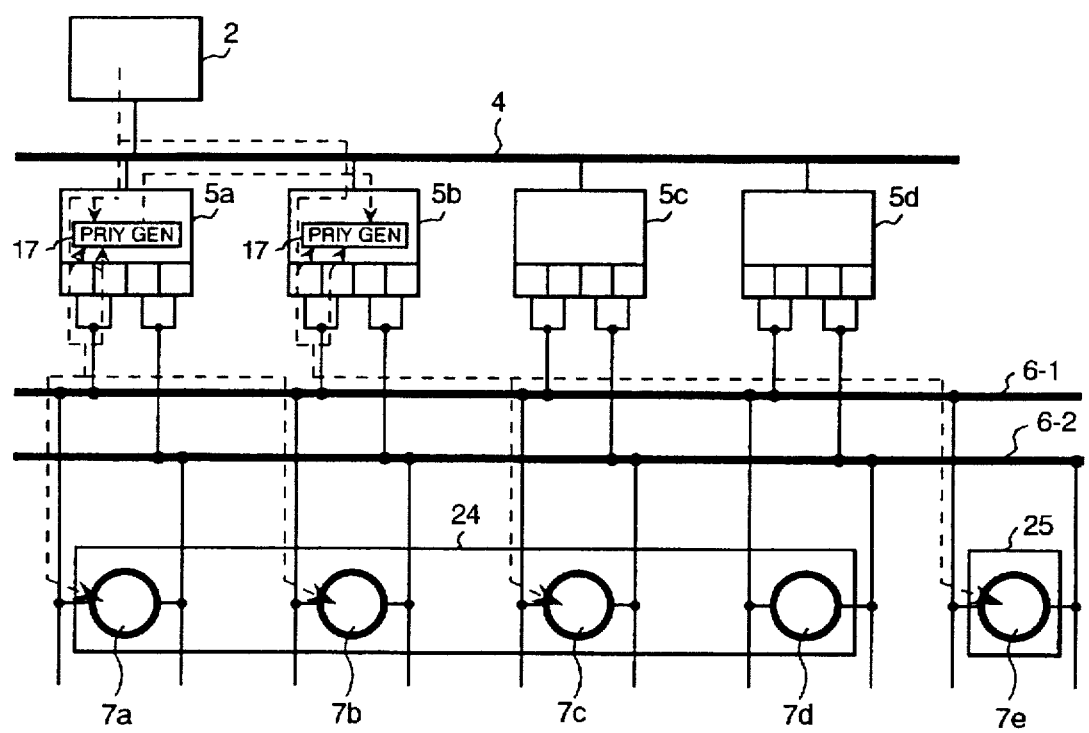
FIG. 9 is a diagrammatic representation of a data flow during a write period for three disk drives using one pass.

An explanation is given with reference to FIG. 9. This is a means adaptable for use in the case where fault or malfunction arises over one path from the disk drive interface controllers to disk drives. When the channel interface controllers notify the disk drive interface controllers of the fact that a write event occurred, two disk drive interface controllers 5a, 5b that received such notice are then selected allowing data transfer to be simultaneously effected from the cache memories 2 toward the disk drive interface controllers. On the other hand, read data transfer is executed from three data disk drives 7a–7c and parity disk drive 7e. Thereafter, at the disk drive interface controller 5a, intermediate parity data will be developed based on the data transferred from the cache memories 2 and the read data of data disk drives, and then be transferred through the internal bus 4 toward the disk drive interface controller 5b. New parity data may then be created based on this data, the data from cache memories 2 and the old read data from disk drives will be used as write data for the parity disk drive. And, write data transfer is made from the disk drive interface controller 5a toward two data disk drives 7a, 7b, as well as from the disk drive interface controller 5b toward one data disk drive 7c. In this way, a series of 3-stripe write/1-path operations are completed.

(7) Case of Performing Three-Stripe Write using Two Paths

Figure 10:
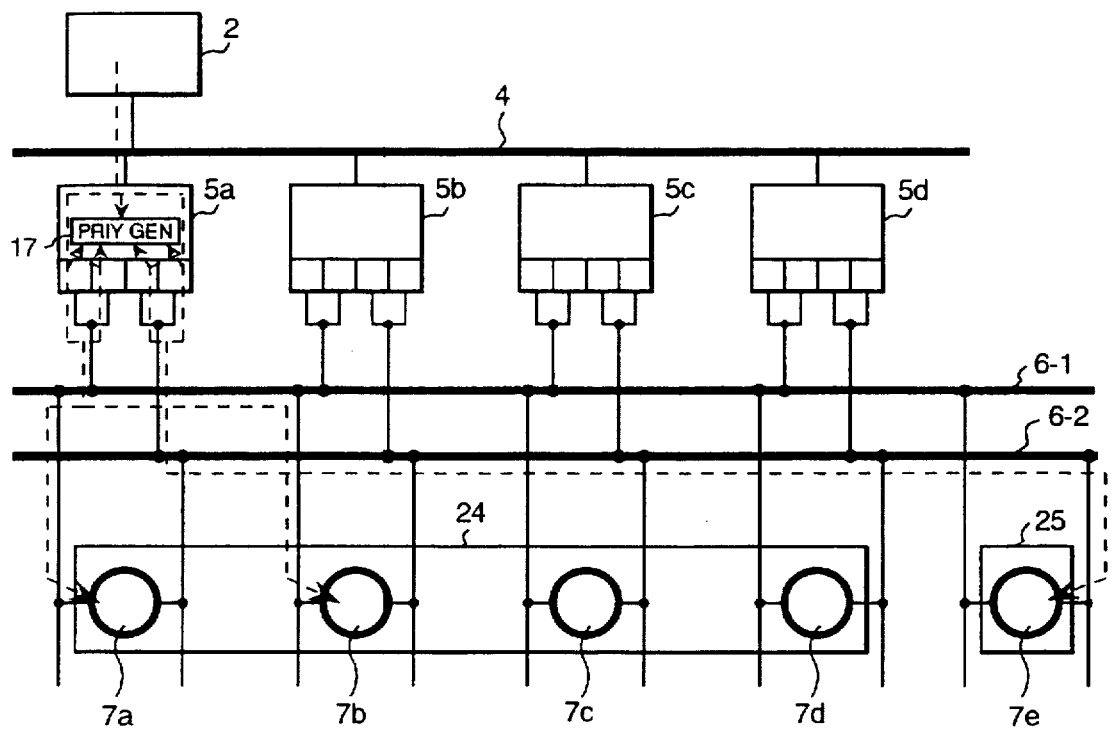
FIG. 10 is a diagrammatic representation of a data flow during a write period for three disk drives using two passes.

An explanation will be given by reference to FIG. 10. The channel interface controllers notify the disk drive interface controllers of the occurrence of a write event; upon receipt of such notice, one disk drive interface controller 5a is selected allowing data to be transferred from the cache memories 2. Simultaneously, the disk drive interface controllers utilize four ports to execute read data transfer of old data from the data disk drives 7a–7c at which the write event occurred and from the parity disk drive 7e. Thereafter, based on the read data of these disk drives and the data as transferred from the cache memories 2, new parity data will then be generated and issued as write data for the parity disk drive 7e. Next, the above data and the data transferred from the cache memories 2 are transferred as write data to the parity disk drive 7e and data disk drives 7a–7c. In this way, a series of 3-stripe write/2-path operations are completed.

It can be seen from the above discussions that since write operations are simultaneously effected among striping groups in each case, the data disk drives of these striping groups exhibit direct communicatable relationship with the disk drive groups, whereby the simultaneous write is enabled by changing the transmission frequency for each disk drive interface controller.

An explanation will now be given of when a host computer accesses the disk drives to read data therefrom. At the channel interface controllers 1 shown in FIG. 1, a command from the host computer is analyzed to verify whether or not data to be read next are present in the cache memories 2. If such data are found therein, the disk drives 7 are not subject to data read; alternatively, the data in the cache memories 2 will be used in order to achieve high-speed operations. In this case, in response to a request from the channel interface controllers 1, transfer of the data from cache memories 2 is performed under the control of the internal bus data transfer controller 11. After conversion of the received data from the FBA data format into CKD data format at the data format converter 10, data transfer is then carried out toward the host computer via the channel interface protocol controller 8.

Figure 11:
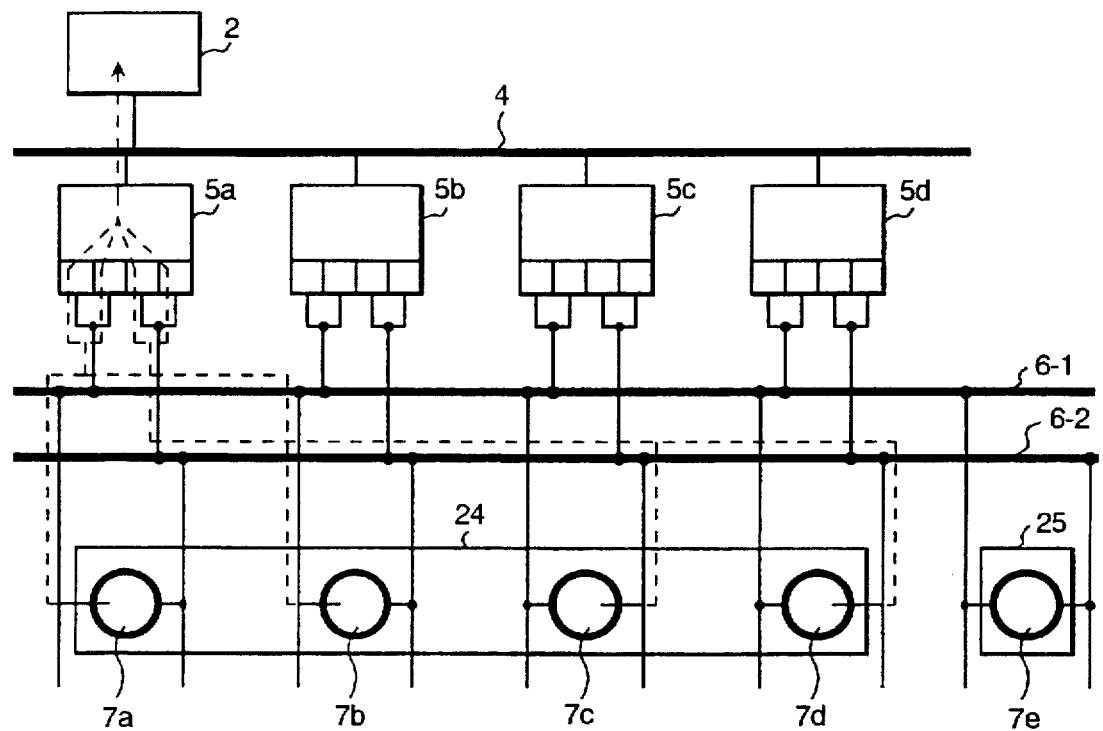
FIG. 11 is a diagrammatic representation of a data flow during a read period by use of two passes.

An explanation is now given of when the cache memories 2 contain no data therein with reference to FIG. 11. When a read request is issued from the channel interface controllers to the disk drive interface controllers, one disk drive interface controller 5a that received such request is then selected performing read transfer of data from any disk drive(s) storing therein the data upon request. In this situation the simultaneous transfer of read data from disk drive 7a and 7e may be enabled by changing the transmission frequency with respect to ports operatively coupled to the disk drive interface controller 5a. It is possible that the paths between the disk drive interface controllers and disk drives are in a degraded state due to the occurrence of one-path of 6-1 and 6-2 fault; if this is the case, the data transfer may be executed by use of two disk drive interface controllers.

Figure 12:
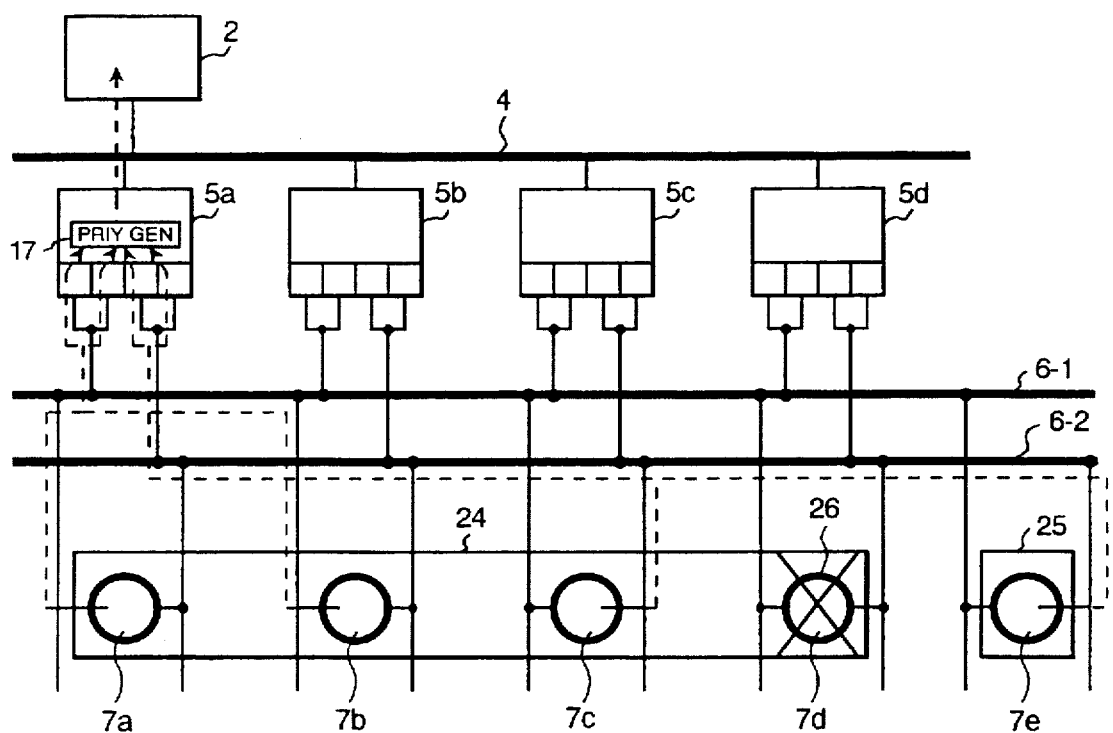
FIG. 12 is a diagrammatic representation of a data flow during a read period upon occurrence of fault or malfunction.

Then, an explanation will be given of when data read in the situation where fault is occurred at the disk drives, by reference to FIG. 12. When a read request is made from the channel interface controllers to the disk drive interface controllers, the disk drive interface controller 5a that has received this request is then selected allowing data transfer to be carried out from the data disk drives 7a–7c which are free from any faults or malfunction and from parity disk drive 7e. Based on these data, the data of the data disk drive 7d whereat fault has occurred may be repaired to recover the entire data structure thereof. When the paths between the disk drive interface controllers and disk drives are in the degenerative state due to the occurrence of one-path fault or malfunction, the data transfer may be executed using two disk drive interface controllers. In this way, a series of read operations are carried out.

Figure 13:
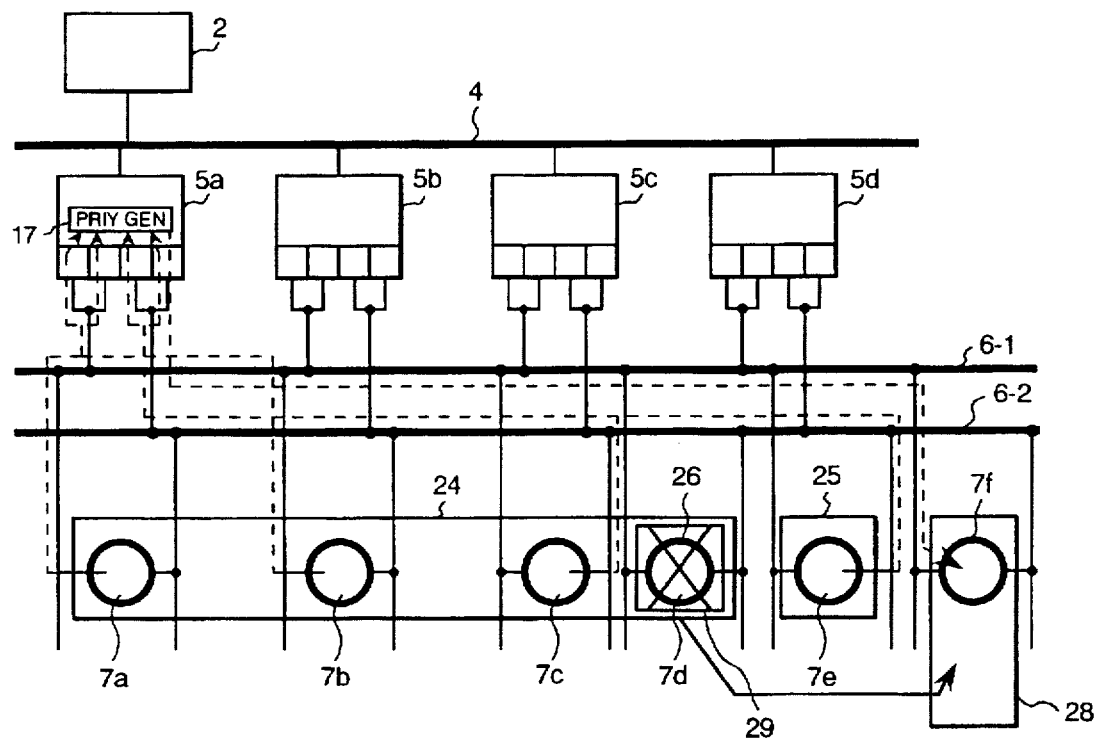
FIG. 13 is a diagrammatic representation of a data flow during malfunction recovery.

Next, a method of reconstructing the data structure after occurrence of fault in a disk drive(s) will be explained with reference to FIG. 13. A spare disk drive group 7F is assigned with an initial set transmission frequency that is different from those for the remaining data disk drive groups and parity disk drive group. Upon occurrence of fault or malfunction, the data structure of such fault disk drive 7d is reconstructed using the disk drive interface controller 5a. The resulting data structure thus reconstructed is newly assigned to one disk drive 7f of the spare disk drive group 7F; then, this disk drive 7f is subject to writing. During such repairing procedure until it is completed with respect to the entire data of disk drive, any services from the host computer are executed while permitting execution of the data repair proceedings. Thereafter, when the data repair is completed, the transmission frequency of such defective, fault-occurred disk drive 7d is set at the frequency reserved for defective disk drives, reallocation or closure of address is performed. Also, the spare disk drive 7f now containing the repaired data therein is reset at the frequency and address of the disk drive 7d whereat fault has occurred. With such an arrangement, it becomes possible to access any disk drives by use of the same paths as those used before the occurrence of fault without the need of any change in disk drive mapping system to thereby ensure that the same operation as those prior to the occurrence of fault is continued without any interruptions.

Figure 14:
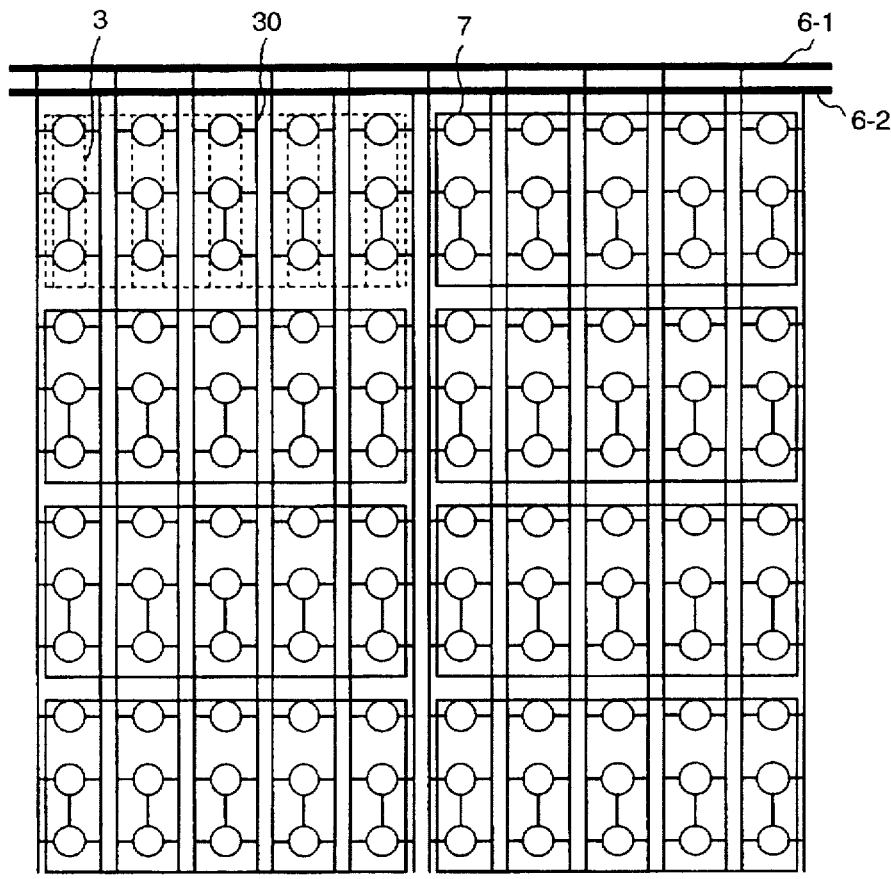
FIG. 14 is a diagram showing a grouping configuration when a number of disk drives are connected.

An explanation is now given of a change-over method adaptable for use when a number of disk drives are interconnected, with reference to FIG. 14. Respective disk drive groups 3 are set at frequencies independently of one another. The connection state thereof may be dynamically changed or modified by causing the disk drive interface controllers so as to select one from among such set frequencies. This may enable each disk drive interface controller to freely select any appropriate one of the disk drive groups 3, which in turn makes it possible to control a virtually increased number of disk drives 7. In this situation it is also possible to perform simultaneous data transfer over a single data line by forcing the frequencies being used for stripe groups 30 to be different from one another with each of them being as a unit. Furthermore, this enables disk drives that do not belong to the same stripe group 30 to be accessed simultaneously, whereby the multiplexity of transfer of respective disk drives 7 can be enhanced to speed up the accessing of disk drives. Still further, the multiplexity can be further enhanced by use of two paths 6-1, 6-2 between the disk drive interface controllers and the disk drives at a time.

Figure 15:
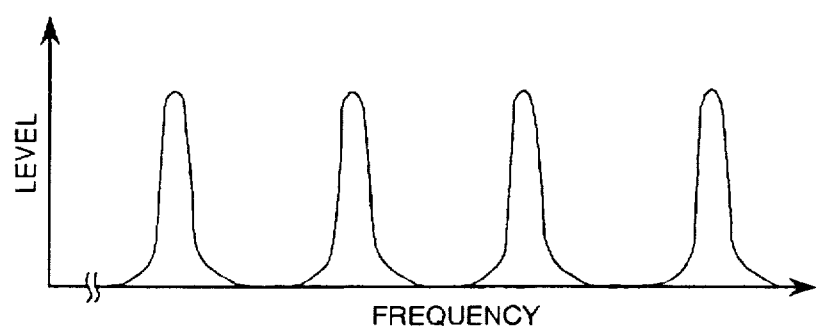
FIG. 15 is a diagram showing the principle of a frequency division multiplex (FDM) transmission scheme.

An explanation will be given as to the FDM transmission scheme. FIG. 15 is a diagram showing the principal concept of the FDM transmission. It is required for any interface performing data transmission that the exclusive occupation band width thereof be narrowed in accordance with the assignment of transmission frequencies because effective assignment of extensive channel numbers will no longer be needed when broader exclusive occupation band width is necessary. On the other hand, since it is required that the data transfer rate be as high as possible, the phase modulation techniques are employed as the modulation scheme therefor providing high-speed data transfer and narrowed exclusive occupation band width while causing the frequency thereof to be on the order of several gigahertz (GHz). With such frequency band, filters or the like may be reduced in size while enabling control logic circuits to differ in frequency from noises so that any possible noise interference can be decreased. Optical fibers may also be utilized as a medium for performing data transmission other than conventional wires.

Figure 16:
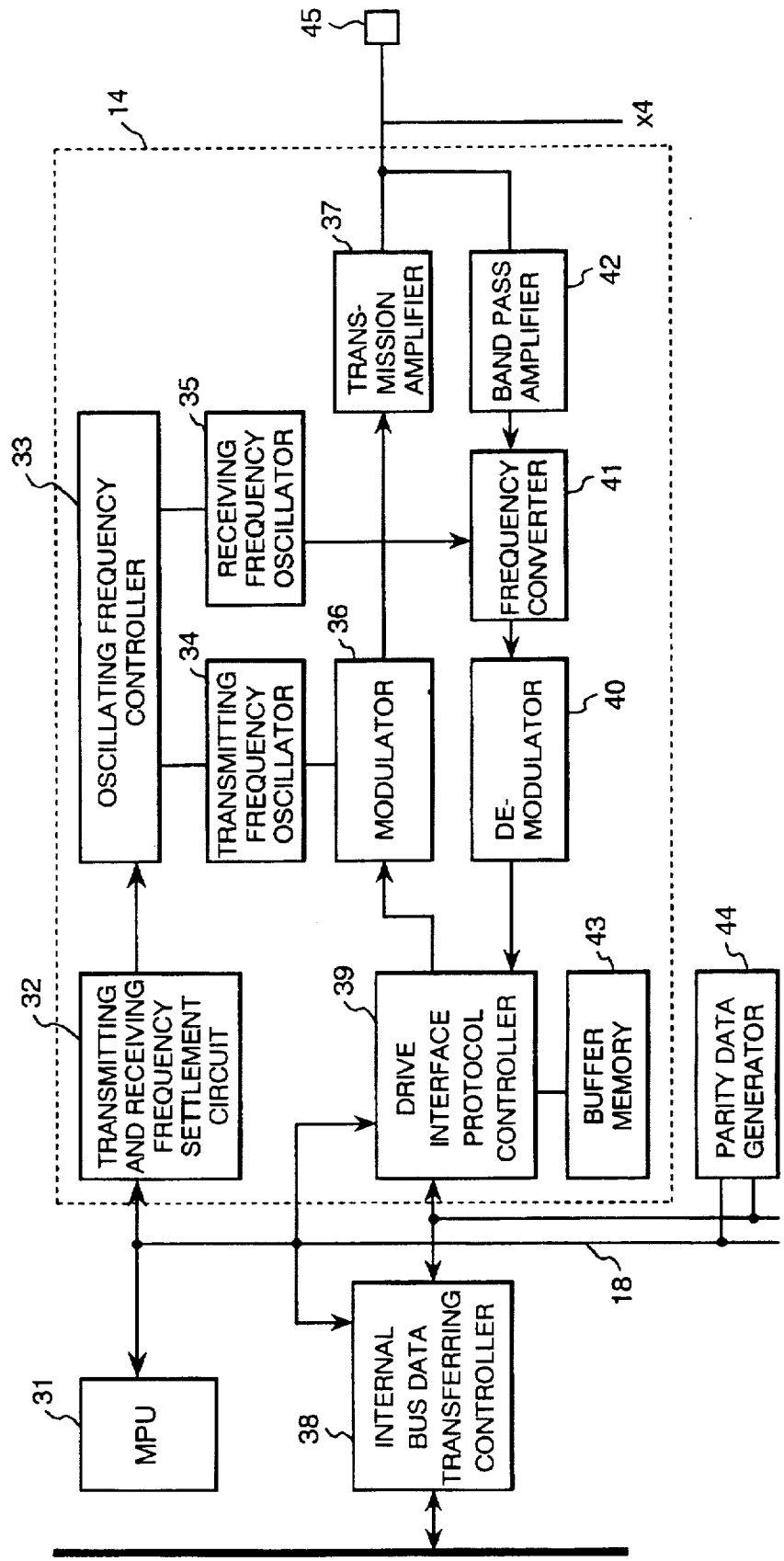
FIG. 16 is a block diagram of an FDM interface controller.

FIG. 16 is a block diagram showing details of the internal configuration of an FDM interface controller 14 as provided within one disk drive interface controller 5 of FIG. 3. This FDM interface controller shown is constituted from a microprocessor 31, a transmitter/receiver frequency setter circuit 32, an oscillation frequency controller 33, a transmitter oscillator 34, a receiver oscillator 35, a modulator 36, a transmitter amplifier 37, an internal transfer controller 38, a disk drive interface protocol controller 39, a demodulator 40, a frequency converter 41, a band amplifier 42, a buffer memory 43 and a parity data generator 44.

In order to perform assignment of the working frequency in FDM data transmission, the microprocessor 31 sets any desired frequency to the transmitter/receiver frequency setter 32. With the working frequency determined, oscillation is performed at an identical value(s) as set by the oscillation frequency controller 33, the transmitter oscillator 34, and the receiver oscillator 35.

Next, the operation will be explained regarding the transmission of data toward the disk drives. Upon receipt of a request from the internal transfer controller 38, data are transferred from the cache memories 2 of FIG. 1 via the internal bus 4 to the internal transfer controller 38. Such data are then subject to several kinds of data conversions at the disk drive interface protocol controller 39, which conversions may involve a disk-drive versus protocol conversion, code conversion, serial data conversion, and the like. The resulting data converted are then modulated by the modulator 36 based on the aforesaid oscillation frequency to be amplified by the transmitter amplifier 37. The resultant amplified data are then sent forth to the disk drives by way of an FDM interface port 45.

An explanation will next be given of the case of data receipt. At the outset, a signal(s) transferred from the disk drives is/are supplied to the band amplifier 42, which causes only a signal having desired frequency to pass therethrough. Thereafter, the signal is converted by the receiver oscillator 35 and frequency converter 41 into a certain signal at an intermediate frequency of a fixed value, which is then input to the demodulator 40 for demodulation and analog-to-digital conversion. This selection of frequency is also executed under the control of the microprocessor 31, which attempts to set a frequency to the transmitter/receiver frequency setter 32.

Subsequently, the resulting digital signal is passed to the disk drive interface protocol controller 39, which effects code conversion and parallel data conversion. The code-converted parallel data are then transferred to the internal transfer controller 38. Upon receipt of the data, this controller 38 transfers data to the internal bus 4 causing the data to be written into the cache memories 2 of FIG. 1. In this way, the data transfer to the disk drives 7 is carried out.

Figure 17:
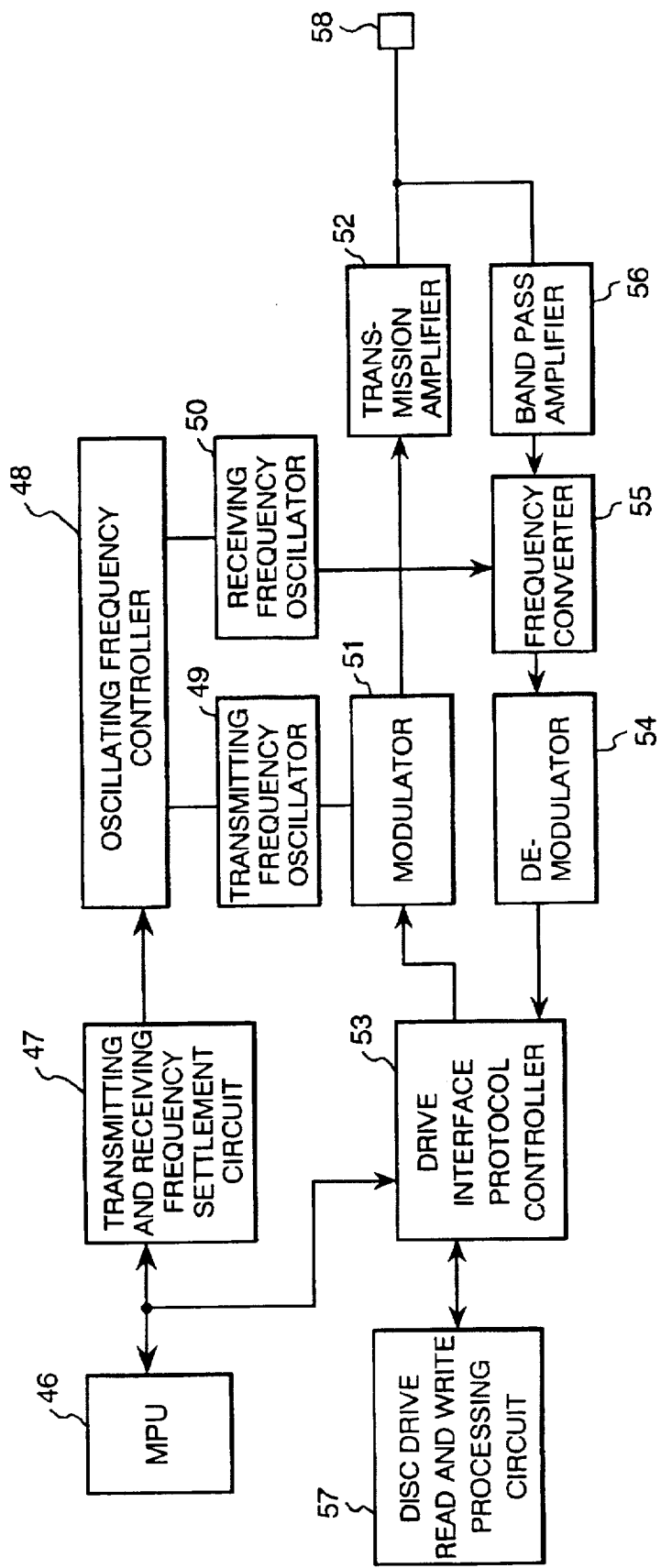
FIG. 17 is a block diagram of a disk drive interface controller.

FIG. 17 is a diagram showing the configuration of an interface section within the disk drives. This interface section is comprised of a microprocessor 46, a transmitter/receiver frequency setter 47, an oscillation frequency controller 48, a transmitter oscillator 49, a receiver oscillator 50, a modulator 51, a transmitter amplifier 52, a disk drive interface protocol controller 53, a demodulator 54, a frequency converter 55, a band amplifier 56 and a disk drive read/write processor circuit 57.

The operation on the part of the disk drives is similar to that for the disk drive interface control in that the frequency therefor is preset for use in performing data transfer after application of power supply. A datum indicative of this preset frequency may be stored in a nonvolatile memory device such as an electrically programmable read-only memory, including a flash memory or the like. Thereafter, when the frequency is to be changed, each disk drive group is changed at any required frequency upon receipt of a corresponding frequency set command from the disk drive interface controllers 5. Note here that selection of a respective one of the disk drives within disk drive groups 3 is performed by assigning an appropriate address to each of them.

In the way as describe above, it is possible for each disk drive interface controller 5 to select any one of the disk drives 7 while enabling an extensive number of disk drives to remain connectable by use of a single interface line during the same processing time period.

With such an arrangement, even when an increased number of disk drives are employed therein, it becomes possible to reduce the interface lines in number between the disk drive interface controllers 5 and the data disk drives 7, which can facilitate additive installation of a disk drive(s).

While specific embodiments of this invention have been described, it is expected that those skilled in the art can and will design alternate embodiments of the invention that fall within the scope of the appended claims.

What is claimed is:

1. A disk array system, comprising:

a plurality of disk drives;

at least one disk drive interface controller; and means for causing a disk drive interface path to employ, as a transmission system thereof, a frequency division multiplex transmission scheme for performing simultaneous transmission of a plurality of data over a single interface line.

2. A disk array system, comprising:

a plurality of disk drives;

at least one disk drive interface controller; and means for causing a disk drive interface path to employ, as a transmission system thereof, a frequency division multiplex transmission scheme for dynamically changing a connection state of said disk drives and said at least one disk drive interface controller thus enhancing multiplicity in accessing said disk drives.

3. The disk array system according to claim 1 or claim 2, wherein said disk drives have a predefined frequency for use in data transmission.

4. A disk array system comprising:

an array of disk drives;

disk drive interface controllers operatively coupled to said disk drives; and means for causing a disk drive interface path to employ, as a transmission system thereof, a frequency division multiplex transmission scheme for dynamically changing a connection state of said disk drives and said disk drive interface controllers thereby allowing a decreased number of disk drive interface controllers to control an increased number of said disk drives.

5. A disk array systems comprising:

an array of disk drives;

disk drive interface controllers operatively coupled to said array of disk drives; and means for causing a disk drive interface to employ, as a transmission system thereof, a frequency division multiplex transmission scheme for closing any of said disk drives having a fault occur therein, for, after restoring data to a spare disk drive, setting the spare disk drive at a transmission frequency and address of the disk drive having the fault occur therein, and for carrying out operations by use of a mapping of an original disk drive.

6. The disk array system according to claim 4 or claim 5, wherein said array of disk drives include a plurality of groups of disk drives each having a predetermined frequency for use in data transmission.

7. The disk array system according to claim 6, wherein said array of disk drives include therein a striping group having data disk drives for storage of data and a parity disk drive for storage of parity generated from the data, wherein said disk drives belonging to said striping group belong to different ones of said plurality of groups of disk drives.

8. The disk array system according to claim 1 or claim 2 or claim 3 or claim 4, wherein said disk drive interface controllers include a transmission/reception frequency setter circuit for setting a specific frequency for use in data transmission.

* * * * *